(12) United States Patent
Westphal

(10) Patent No.: US 7,365,540 B2
(45) Date of Patent: Apr. 29, 2008

(54) HYBRID MAGNET CONFIGURATION

(75) Inventor: Michael Westphal, Offenbach (DE)

(73) Assignee: Bruker Biospin GmbH, Rheinstetten (DE)

(*) Notice: Subject to any disclaimer, the term of this patent is extended or adjusted under 35 U.S.C. 154(b) by 91 days.

(21) Appl. No.: 11/052,832

(22) Filed: Feb. 9, 2005

(65) Prior Publication Data

US 2006/0061361 A1    Mar. 23, 2006

(30) Foreign Application Priority Data

Feb. 14, 2004   (DE) .................. 10 2004 007 291

(51) Int. Cl.
*G01V 3/00* (2006.01)
(52) U.S. Cl. ....................................... 324/318
(58) Field of Classification Search ................. 324/318
See application file for complete search history.

(56) References Cited

U.S. PATENT DOCUMENTS

| | | | | |
|---|---|---|---|---|
| 4,590,428 A * | 5/1986 | Muller et al. | ................ | 324/320 |
| 4,658,229 A * | 4/1987 | Chen et al. | .................. | 335/216 |
| 4,768,009 A * | 8/1988 | Shimada | ..................... | 335/299 |
| 4,931,759 A | 6/1990 | Breneman | | |
| 6,084,497 A | 7/2000 | Crozier | | |
| 6,507,259 B2 | 1/2003 | Westphal | | |
| 6,556,013 B2 * | 4/2003 | Withers | ....................... | 324/322 |
| 6,853,281 B1 * | 2/2005 | Kakugawa et al. | ......... | 335/296 |
| 2002/0140535 A1 | 10/2002 | Neuberth | | |
| 2004/0051613 A1* | 3/2004 | Yoshida et al. | ............. | 335/299 |

FOREIGN PATENT DOCUMENTS

| | | |
|---|---|---|
| DE | 102 02 372 | 8/2003 |
| EP | 0 414 528 | 2/1991 |
| EP | 0 332 176 | 10/1995 |
| EP | 1 229 340 | 8/2002 |
| GB | 2 355 800 | 6/2001 |
| JP | 2001 242231 | 7/2002 |

* cited by examiner

*Primary Examiner*—Brij Shrivastav
*Assistant Examiner*—Megann E Vaughn
(74) *Attorney, Agent, or Firm*—Paul Vincent

(57) ABSTRACT

A co-axial magnet configuration for the production of a magnetic field and investigational volume which is suitable for measurement of magnetic resonance has at least one superconducting solenoid coil or solenoid coils which are radially nested within each other, wherein the windings of the solenoid coil(s) in a radial region about the axis of the magnetic configuration are disposed between r1 and r2, wherein r1<r2 is characterized in that the windings are surrounded by at least one rotationally symmetric magnet body made from ferromagnetic material which extends over a radial region between r3 and r4 wherein r3<r4 wherein r2<r3<1.3 r2 and r4>1.3 r3, wherein the rotationally symmetric magnet body or bodies are structured, dimensioned and positioned in such a fashion that the magnetic field is homogenized in the investigational volume and the magnetic fringe field outside the magnet configuration is essentially suppressed to permit the production of strong magnetic fields of high homogeneity without requiring notches in the coil configuration.

31 Claims, 7 Drawing Sheets

| Component | z1/m | z2/m | r1/m | r2/m | r3/m | r4/m | r5/m | r6/m | r7/m | J/(A/m²) | P/T |
|---|---|---|---|---|---|---|---|---|---|---|---|
| Solenoid | -0.29 | 0.29 | 0.13 | 0.155 | | | | | | 2.60x10⁸ | - |
| 1. Magnet body | -0.28 | -0.085 | | | 0.16 | 0.32 | | | | - | -2.1 |
| 2. Magnet body | 0.085 | 0.28 | | | 0.16 | 0.32 | | | | - | -2.1 |
| 1. add. winding | -0.275 | -0.09 | | | | | | 0.320 | 0.324 | -1.65x10⁸ | - |
| 2. add. winding | 0.09 | 0.275 | | | | | | 0.320 | 0.324 | -1.65x10⁸ | - |
| Field forming dev. | -0.119 | 0.119 | | | | | 0.07 | | | - | 2.1 |

Table 1: The components of the inventive magnet configuration are listed as entries with respect to their axial and radial dimensions, the current densities and polarization of the windings and of the magnet body as well as the field forming device. The configuration produces a homogenous field having an induction of 7.009 T. The field forming device is more precisely specified in tables 3 and 4.

| h2 z0²/h0 | h4 z0⁴/h0 | h6 z0⁶/h0 | h8 z0⁸/h0 | h10 z0¹⁰/h0 | h12 z0¹²/h0 | h14 z0¹⁴/h0 | h16 z0¹⁶/h0 | h18 z0¹⁸/h0 | h20 z0²⁰/h0 |
|---|---|---|---|---|---|---|---|---|---|
| 2693 ppm | -740 ppm | -5.2 ppm | 2.33 ppm | < 0.2 ppm | < 0.2 ppm | < 0.2 ppm | < 0.2 ppm | < 0.2 ppm | < 0.2 ppm |

Table 2: The field interferences $h_2 z_0^2$, $h_4 z_0^4$, ... of the magnet configuration according to Table 1 without the field forming device at an axial position $z_0 = 0.05$ m, relative to the magnet field $h_0$ of the magnet configuration at $z = 0$. The choice of $z_0 = 0.05$ m corresponds approximately to the radial extent of the approximately spherical region about the center $z = 0$ in which the magnet configuration including the field forming device should produce a field with deviations of less than 10 ppm.

| | A | B | C | D | E | F | G | H | I | J | K | L | M | N | O |
|---|---|---|---|---|---|---|---|---|---|---|---|---|---|---|---|
| z0/mm | -112 | -96 | -80 | -64 | -48 | -32 | -16 | 0 | 16 | 32 | 48 | 64 | 80 | 96 | 112 |

Table 3: The average axial positions for attachment of plates made of iron having dimensions of 14 mm x 10 mm x 0.2 mm onto a cylindrical support of the field forming device. For every axial position 40 azimuthal positions are provided about the periphery. The plates are located on an average cylinder radius r5 = 70 mm. The field forming device can, e.g. be integrated in the gradient coil configurations which are necessary for imaging NMR procedures or localized NMR spectroscopy or, alternatively, can be attached to the room temperature bore of a cryostat of the magnet configuration.

| NR | A | B | C | D | E | F | G | H | I | J | K | L | M | N | O |
|---|---|---|---|---|---|---|---|---|---|---|---|---|---|---|---|
| 1 | 5 | 6 | 9 | 12 | 5 | 3 | 0 | 0 | 0 | 3 | 5 | 12 | 9 | 6 | 5 |
| 2 | 5 | 6 | 9 | 12 | 5 | 3 | 1 | 0 | 1 | 3 | 5 | 12 | 9 | 6 | 5 |
| 3 | 5 | 5 | 8 | 12 | 5 | 3 | 1 | 0 | 1 | 3 | 5 | 12 | 8 | 5 | 5 |
| 4 | 5 | 6 | 9 | 12 | 6 | 3 | 0 | 0 | 0 | 3 | 6 | 12 | 9 | 6 | 5 |
| 5 | 5 | 6 | 8 | 12 | 5 | 3 | 1 | 0 | 1 | 3 | 5 | 12 | 8 | 6 | 5 |
| 6 | 5 | 6 | 9 | 12 | 5 | 3 | 0 | 0 | 0 | 3 | 5 | 12 | 9 | 6 | 5 |
| 7 | 5 | 5 | 9 | 12 | 5 | 4 | 1 | 0 | 1 | 4 | 5 | 12 | 9 | 5 | 5 |
| 8 | 5 | 6 | 8 | 12 | 5 | 3 | 1 | 0 | 1 | 3 | 5 | 12 | 8 | 6 | 5 |
| 9 | 5 | 6 | 9 | 12 | 5 | 3 | 0 | 0 | 0 | 3 | 5 | 12 | 9 | 6 | 5 |
| 10 | 5 | 6 | 8 | 12 | 5 | 3 | 1 | 0 | 1 | 3 | 5 | 12 | 8 | 6 | 5 |
| 11 | 5 | 6 | 9 | 12 | 5 | 3 | 1 | 0 | 1 | 3 | 5 | 12 | 9 | 6 | 5 |
| 12 | 5 | 5 | 9 | 12 | 5 | 3 | 0 | 0 | 0 | 3 | 5 | 12 | 9 | 5 | 5 |
| 13 | 5 | 6 | 8 | 12 | 5 | 3 | 1 | 0 | 1 | 3 | 5 | 12 | 8 | 6 | 5 |
| 14 | 5 | 6 | 9 | 12 | 5 | 4 | 0 | 0 | 0 | 4 | 5 | 12 | 9 | 6 | 5 |
| 15 | 5 | 6 | 8 | 12 | 5 | 3 | 1 | 0 | 1 | 3 | 5 | 12 | 8 | 6 | 5 |
| 16 | 5 | 5 | 9 | 12 | 6 | 3 | 1 | 0 | 1 | 3 | 6 | 12 | 9 | 5 | 5 |
| 17 | 5 | 6 | 9 | 12 | 5 | 3 | 0 | 0 | 0 | 3 | 5 | 12 | 9 | 6 | 5 |
| 18 | 5 | 6 | 8 | 12 | 5 | 3 | 1 | 0 | 1 | 3 | 5 | 12 | 8 | 6 | 5 |
| 19 | 5 | 6 | 9 | 12 | 5 | 3 | 0 | 0 | 0 | 3 | 5 | 12 | 9 | 6 | 5 |
| 20 | 5 | 6 | 8 | 12 | 5 | 3 | 1 | 0 | 1 | 3 | 5 | 12 | 8 | 6 | 5 |
| 21 | 5 | 5 | 9 | 12 | 5 | 4 | 1 | 0 | 1 | 4 | 5 | 12 | 9 | 5 | 5 |
| 22 | 5 | 6 | 9 | 12 | 5 | 3 | 0 | 0 | 0 | 3 | 5 | 12 | 9 | 6 | 5 |
| 23 | 5 | 6 | 8 | 12 | 5 | 3 | 1 | 0 | 1 | 3 | 5 | 12 | 8 | 6 | 5 |
| 24 | 5 | 6 | 9 | 12 | 5 | 3 | 1 | 0 | 1 | 3 | 5 | 12 | 9 | 6 | 5 |
| 25 | 5 | 5 | 8 | 12 | 5 | 3 | 0 | 0 | 0 | 3 | 5 | 12 | 8 | 5 | 5 |
| 26 | 5 | 6 | 9 | 12 | 5 | 3 | 1 | 0 | 1 | 3 | 5 | 12 | 9 | 6 | 5 |
| 27 | 5 | 6 | 9 | 12 | 6 | 3 | 0 | 0 | 0 | 3 | 6 | 12 | 9 | 6 | 5 |
| 28 | 5 | 6 | 8 | 12 | 5 | 4 | 1 | 0 | 1 | 4 | 5 | 12 | 8 | 6 | 5 |
| 29 | 5 | 6 | 9 | 12 | 5 | 3 | 1 | 0 | 1 | 3 | 5 | 12 | 9 | 6 | 5 |
| 30 | 5 | 5 | 8 | 12 | 5 | 3 | 0 | 0 | 0 | 3 | 5 | 12 | 8 | 5 | 5 |
| 31 | 5 | 6 | 9 | 12 | 5 | 3 | 1 | 0 | 1 | 3 | 5 | 12 | 9 | 6 | 5 |
| 32 | 5 | 6 | 9 | 12 | 5 | 3 | 1 | 0 | 1 | 3 | 5 | 12 | 9 | 6 | 5 |
| 33 | 5 | 6 | 8 | 12 | 5 | 3 | 0 | 0 | 0 | 3 | 5 | 12 | 8 | 6 | 5 |
| 34 | 5 | 5 | 9 | 12 | 5 | 3 | 1 | 0 | 1 | 3 | 5 | 12 | 9 | 5 | 5 |
| 35 | 5 | 6 | 8 | 12 | 5 | 4 | 0 | 0 | 0 | 4 | 5 | 12 | 8 | 6 | 5 |
| 36 | 5 | 6 | 9 | 12 | 5 | 3 | 1 | 0 | 1 | 3 | 5 | 12 | 9 | 6 | 5 |
| 37 | 5 | 6 | 9 | 12 | 5 | 3 | 1 | 0 | 1 | 3 | 5 | 12 | 9 | 6 | 5 |
| 38 | 5 | 6 | 8 | 11 | 6 | 3 | 0 | 0 | 0 | 3 | 6 | 11 | 8 | 6 | 5 |
| 39 | 5 | 5 | 9 | 12 | 5 | 3 | 1 | 0 | 1 | 3 | 5 | 12 | 9 | 5 | 5 |
| 40 | 5 | 6 | 8 | 12 | 5 | 3 | 1 | 0 | 1 | 3 | 5 | 12 | 8 | 6 | 5 |

Table 4: The occupation of the iron plates of the field forming device according to table 3 at the 15 axial positions indicated with A, B, C, ... as well as the 40 azimuthal positions which are designated with 1, 2, 3, ..., . With this occupation, the overall magnetic field configuration produces a homogenous magnetic field. The field deviations listed in table 2 of the magnet configuration without field forming device are reduced to the field deviations listen in table 5 by means of these occupations. The plates having overall mass of 3.42 kg.

| h2 z0²/h0 | h4 z0⁴/h0 | h6 z0⁶/h0 | h8 z0⁸/h0 | h10 z0¹⁰/h0 | h12 z0¹²/h0 | h14 z0¹⁴/h0 | h16 z0¹⁶/h0 | h18 z0¹⁸/h0 | h20 z0²⁰/h0 | h22 z0²²/h0 |
|---|---|---|---|---|---|---|---|---|---|---|
| 0 ppm | 0 ppm | 0 ppm | 0 ppm | 0 ppm | -12.2 ppm | 6.2 ppm | 2.25 ppm | -4.63 ppm | 3.29 ppm | -1.44 ppm |

Table 5: The theoretical field interferences $h_2, h_4 \ldots$, of the magnet configuration according to Table 1 with the field forming device according to Tables 3 and 4 in the same representation as Table 3. The field disturbances of higher order are less than 1 ppm.

HYBRID MAGNET CONFIGURATION

This application claims Paris Convention priority of DE 10 2004 007 291.4 filed Feb. 14, 2004 the entire disclosure of which is hereby incorporated by reference.

BACKGROUND OF THE INVENTION

The invention concerns a coaxial magnet configuration for production of a magnetic field in an investigation of volume which is suitable for measurement of magnetic resonance with at least one superconducting solenoid coil or with solenoid coils which are radially nested within each other, wherein the windings of the solenoid coil (s) in a radial region about the axis of the magnet configuration are disposed between r1 and r2 wherein r1>r2.

The magnetic field h(z) as a function of the coordinate z on the axis of a magnet system of this kind can be generally expressed as follows:

$$h(z)=h_0+h_1z+h_2z^2+h_3z^3+h_4z^4+h_5z^5+h_6z^6+$$

The term $h_0$ thereby represents the desired position independent and therefore homogenous magnetic field. The additional terms with the coefficients $h_1$, $h_2$ . . . describe changes in the magnetic field strength as a function of the spatial coordinate z and are undesirable in magnets for applications in NMR, MRI, or ICR apparatus. A mirror symmetric construction relative to the middle plane leads to the suppression of all terms having uneven indices, at least theoretically. Moreover, it is furthermore desirable to choose the shape of magnetic configuration in such a fashion that the interfering coefficients having even indices, in particular those with small indices, systematically vanished. In a suitable magnet configuration, the expression for the magnetic field h(z) can then be simplified as follows:

$$h(z)=h_0+h_8z^8+\text{terms of higher order.}$$

In this case, an interfering field in the form of a parabola of $8^{th}$ order overlaps the homogenous magnetic field $h_0$. This interference assumes arbitrarily small values for sufficiently small values of z. In a magnetic configuration of this kind there is characteristic length $z_0$ at which the size of the interference $h_8z_0^8$ has a value $d_{hmax}$ which constitutes a tolerable maximum value for the associated configuration. For NMR apparatuses, these values are typically 1 ppm (part per million), relative to the $B_0$ value. In rotationally symmetric magnetic configurations of this kind, the magnetic field h(z) is not only theoretically homogeneous within the above mentioned limit along the axis in the region $-z_0<z<z_0$, rather within a spherically shaped region about the symmetry center of radius $z_0$. This region is designated as the investigational volume of the magnet configuration. The larger the size of the desired investigational volume relative to the inside diameter of the portion of the magnetic configuration generating the magnetic field, the higher the required order of the magnetic configuration.

In order to produce stronger magnetic fields, cooled windings made from superconducting wire are preferentially used. The simplest geometrical form for such a magnet coil is a solenoid coil. However, solenoid coils are not suitable for production of homogenous magnetic fields, since this simple geometry has, up to this point, not been capable of compensating for the interfering coefficients $h_2$, $h_4$, . . . . It is therefore conventional in the art to use solenoid coils having one or more notches in order to produce homogenous magnetic fields with such windings. Such notches allow the interfering coefficients $h_2$ and $h_4$ to be compensated for so that the above described configuration can represent a magnet configuration of $6^{th}$ order. A substantial disadvantage of utilization of magnet coils having notches which, in practice, are fashioned by rings filled up with a solid material, is that the bordering windings made from superconducting wire can undergo a transition into the normally conducting state in response to the large magnetic forces which lead to friction or other relaxation phenomena in the bordering region. This process, designated as a quench, leads to a complete discharge of the superconducting magnet with the energy stored in the magnetic field being turned into heat. As a result thereof, an overheating of the normally conducting regions can occur and, in extreme cases, the magnet coil can be destroyed. This makes, in particular, the production of extremely high magnetic fields difficult or makes the magnetic coil more expensive, since one is forced to limit the current strength through the wires in order to keep the magnetic forces which act on the superconducting wire in the regions bordering a notch sufficiently small. The magnet configuration is consequently provided with a correspondingly greater number of windings of expensive superconducting wire and the entire configuration becomes radially larger, which finally limits the maximum achievable magnetic induction in the investigational volume.

An additional problem with magnet configurations is that they produce highly undesirable magnetic fringe fields in a region of up to 10 m about the magnet configuration. In this region, e.g. magnetic storage media can be erased and magnetic objects can be pulled into the magnet configuration and catapulted therein. The stray field therefore constitutes a danger region.

U.S. Pat. No. 6,507,259 discloses a magnetic configuration of the kind described above having additional radially outwardly disposed superconducting shielding coils in which the current flows in an opposite direction. These shielding coils produce a counter magnetic field to substantially suppress the stray field produced by the magnet configuration (active shielding). However, towards this end, additional windings of superconducting wire are required as well as a support body for the shielding windings as a result of which the magnet configuration becomes more complicated, larger, and more expensive.

Another possibility for suppressing the stray field produced by the magnet configuration is disclosed in U.S. Pat. No. 4,590,428. The collar configuration disclosed therein is surrounded with a ferromagnetic cylinder jacket, which serves for shielding outer stray fields and also effects a feed-back for the magnetic flux of the magnet configuration to thereby limit the magnetic stray field produced by the coil configuration (passive shielding). This configuration has the disadvantage that the weight of the magnet configuration is very high due to the large ferromagnetic cylindrical jacket and, in addition, produces an undesirable influence on the homogeneity of the field.

It is therefore the object of the current invention to propose a simple magnet construction for the production of strong magnetic fields with which there is no need for notches in the solenoid coils of the magnet configuration, wherein the magnetic field produced by this magnet configuration should have high homogeneity in the investigational volume. A further object of the invention is to minimize the magnetic stray field of the magnet configuration in an economical fashion.

SUMMARY OF THE INVENTION

These objects are achieved in accordance with the invention in that the windings of the inventive magnet configuration are surrounded by at least one rotationally symmetric magnet body made from a ferromagnetic material which extends through a radial region between r3 and r4 wherein r3<r4 and r2<r3<1.3 r2 and r4>1.3 r3, wherein the rotationally symmetric magnet body is structured, dimensioned, and positioned in such a fashion that the magnetic field in the investigational volume is rendered homogenous and the stray field of the magnet is substantially suppressed outside of the magnet configuration. Towards this end, r2 corresponds to the outer radius of the solenoid coil, r3 to the inner radius of the magnet body (or magnet bodies) and r4 the outer radius of the magnet body or magnet bodies.

The magnet bodies surrounding the solenoid coil render the magnetic field in the investigational volume homogenous and also provide a feed-back for the flux generated by the solenoid coil. The magnet body(s) are thereby disposed relatively close to the axis of the solenoid coil (r3<1.3 r2). In this fashion, the magnetic field produced by the solenoid coil can be influenced to an extremely good extent by the magnet body. The influence of the magnet body on the magnetic field depends, in particular, on the structure of the magnet body. This structure can be effected both in a radially inward as well as the radial outward region of the magnet body. In particular, through the positioning as well as the shaping of the magnet body in its radially inner region, it is possible to compensate for the inhomogeneities of the magnetic field produced by the solenoid coil. The choice of the outer radius r4 of the magnet body has substantial influence on the spatial limitation of the magnetic field so that the fringe field produced by the solenoid coil can be reduced through a suitable choice of parameters even without using a shielding coil made from a super-conducting material. Use of a simple solenoid coil allows the magnetic forces on the coil windings to be controlled to an improved extent such that the field strength at which the magnet quenches can be substantially increased. In this manner, it is possible to increase the strength of the current flowing through the windings as well as the magnetic field produced thereby and/or to produce a given magnetic field of a given strength using a magnet configuration having a reduced number of windings and using higher current to thereby reduce costs. The magnet configuration in accordance with the invention therefore presents possibilities to produce a more homogenous field which is suitable for a measurement of magnetic resonance using a reliable solenoid coil.

In a preferred embodiment of the invention, a field device made from a ferromagnetic material is disposed in a radial region r5<r1 and the rotationally symmetric magnet body(s) are structured, dimensioned, and positioned in such a fashion that, in cooperation with the field forming device, the magnet field in the investigational volume is rendered homogenous and the magnetic stray field is substantially suppressed outside of the magnet configuration by means of the magnet body(s). In this fashion, a particularly simple construction for the magnet body can be realized. In this manner, by way of example, the number of magnet bodies can be kept small and their structure simple. In addition, the field forming device effects a shortening of the overall configuration so that a more compact magnet configuration can be realized.

The field forming device preferentially includes at least 10 ring-shaped element groups, wherein each element group contains at least 6 and preferentially at least 12 individual elements distributed in the peripheral direction about the corresponding ring periphery. In this fashion, a precise fine tuning of the homogeneity of the magnet field is achieved.

In a particularly preferred embodiment, the field forming device includes a cylindrically shaped ferromagnetic sheet having openings. This represents a particularly simple and economical possibility for configuring a field forming device.

In an additional embodiment of the invention, the solenoid coil, the magnet body, and the field forming device produce a magnetic field shape during operation in the investigational volume whose z component in a series expansion along the z axis about the symmetry center of the investigational volume assumes the following dependence: $h(z)=h_0+h_2 z^2 + h_4 z^4 + \ldots + h_{2n} z^{2n}$, wherein the combined contribution of a solenoid coil or coils and the magnetic body to the magnetic field term $h_2/h_0$ of second order is positive and the contribution to the magnetic field term $h_4/h_0$ of $4^{th}$ order is negative, wherein the contribution of the field forming device to the magnetic term $h_2/h_0$ of second order is negative and the contribution to the magnetic field term $h_4/h_0$ of $4^{th}$ order is positive. In this manner, economical magnet configurations can be realized with particularly small axial length. Moreover, for compensating the magnetic field terms of low order, for example $2^{nd}$ to $8^{th}$ order or $10^{th}$ order, particularly low amounts of ferromagnetic material are needed in the field forming device and a particularly large homogeneity volume is achieved.

It has turned out to be particularly advantageous when the quotient multiplied by (–1) of the magnetic field terms h2 and h4 is at least equal to the half square of the radius r5 of the field forming device.

In a particularly preferred embodiment of the magnet configuration, precisely two magnet bodies are provided which are preferably configured in the form of circular rings having rectangular cross-sections which are disposed symmetrically relative to a middle plane transverse to the axis of the magnet configuration. In this fashion, a particularly simple configuration of the magnet configuration is achieved which is suitable, without taking into account the field forming device, to produce a positive magnetic field term $h_2/h_0$ and a negative magnetic field term $h_4/h_0$. The two magnet bodies are preferentially disposed proximate the axial ends. In this fashion, the two magnet bodies produce, in and of themselves, a positive contribution to the magnetic field $h_2/h_0$. In addition, mechanical tolerances on the borders of the magnet body or inhomogeneities in materials result in only slight disturbances in the homogeneity of the magnetic field in the investigational volume.

Another possibility is to provide for a precisely four magnet bodies in the magnet configuration in accordance with the invention which are preferably configured as circular rings having rectangular cross-sections. The four magnet bodies can be disposed in such a fashion and/or structured such that one does not need the field forming device.

The solenoid coil or coils and the magnet body, without taking into configuration other magnetic field producing elements, preferably produce a magnetic field shape in the investigational volume whose z components in a series expansion along its z axis about the symmetry center of the investigational volume assume the volume are given by: $h(z)=h_0+h_2 z^2 + h_4 z^4 + \ldots + h_{2n} z^{2n}$, wherein the magnet bodies are positioned and dimensioned in such a fashion that magnetic field terms of second, fourth and sixth order vanish ($h_2=h_4=h_6=0$). In this manner, a magnetic configuration of $8^{th}$ order is realized, as is desirable for the measurement of magnetic resonance.

In a particularly preferred embodiment of the invention, the magnetic configuration constitutes a magnetic configuration of $10^{th}$ order having a residual inhomogeneity of $<10^{-5}$ in the investigational volume when taking into consideration all ferromagnetic elements.

The magnet bodies are preferentially made from a soft magnetic material, in particular from iron or magnetic steel. In the non-charged state, a magnet system of this type does not produce stray fields in consequence of reminence effects. Special iron or magnetic steel are also relatively inexpensive soft magnetic materials.

In a further embodiment, r4 is larger than 1.5 r3. Through the corresponding minimal thickness of the magnet body, one guarantees that the magnetic flux radially outside of the magnet coil is substantially passed within the magnet body as a result of which the extent of the magnetic fringe field of the configuration remains, as is desired, small.

In an additional embodiment, r4<3r3. This supports configuration of a relatively large magnetic induction within the magnet body and leads, in consequence thereof, to a relatively large magnetic polarization of the magnet body. One therefore needs less material for the production of optimum magnetic field terms $h_2/h_0$ and $h_4/h_0$ by the magnet configuration without taking into consideration the field forming device and consequently less material for the field forming device, thereby leading to a compact and economical magnet configuration.

In a further preferred embodiment of the invention, r4 is chosen in such a fashion that, during operation of the magnet configuration, the magnitude of the magnetic conduction B in the magnet body in a radial region between r3 and 1.05 r3 is at least equal to the magnitude of the saturation polarization $M_S$ of the ferromagnetic material. By taking advantage of the maximum polarization of the magnet body (saturation polarization $M_S$), in particular in the inner region of the magnet body, less magnetic material is required for the magnet body to produce an optimum magnetic field term $h_2/h_0$ and $h_4/h_0$ of the magnet configuration without taking into account the field forming device, wherein the configuration becomes particularly compact and economical.

In a preferred embodiment, the magnet body is cooled during operation and preferentially to the same cryogenic temperature as the superconducting solenoid coil. Thermal shielding of the magnet body relative to the solenoid coil is therefore no longer necessary.

Since the magnet body is preferably rigidly connected to a support body for the solenoid coil(s), no motion occurs between the individual construction components despite the large magnetic forces.

In a particularly preferred embodiment of the magnet configuration, additional windings made from superconducting wire are provided radially outside of the magnet body or in a radial region $r6 \geq 0.9$ r4 in the outer edge region of the magnet body. In this manner, the shape of the magnetic fringe field can be improved and, moreover, one can bundle magnetic flux within the magnet body. In this fashion, an advantageous increase in the magnetization of the magnet body(s) is achieved so that magnet bodies having small volumes can be utilized to construct the magnet configuration. In consequence of the magnet bodies, the additional windings can thereby effect an active shielding while requiring substantially less current (ampere windings) than is necessary in the actively shielded devices of prior art.

The additional windings are preferentially superconductingly short circuited at least during operation, e.g. even prior to charging of the magnet coil. In consequence thereof, the winding is charged up during charging of the solenoid coil in an inductive fashion in consequence of the associated magnetization of the magnet body. Since the magnetic flux through the additional coils remains constant, currents are automatically established which minimize the stray field of the magnet configuration. Even during charging or discharging of the magnet configuration, the extent of the magnetic stray field thereby remains small despite the non-linear characteristic magnetization dependence of the magnet body.

The magnet body or bodies can advantageously serve as a support body for further coils. In this manner, no additional support bodies are required.

In a particularly preferred embodiment, additional coils only include one to three layers of superconducting wire. In this manner, only small amounts of superconducting wire are required for the windings so that expense and effort are relatively low compared to conventional shielding devices.

In a further embodiment of the invention, the additional windings include a plurality of partial windings which are axially separated from each other, and each of which can be superconductingly short circuited. Since magnetic fluxes through a plurality of superconducting circuits can be held constant it is possible to provide locally adjusted and thereby precise shielding of the magnetic stray field.

In a further embodiment, the additional windings are circuited in series or can be circuited in series with the solenoid coil or coils and in a superconducting fashion. The windings can therefore be charged along with the solenoid coil using the same power supply.

In a further embodiment of the magnet configuration in accordance with the invention, the additional windings are continuously electrically connected to the solenoid coil or coils. The same current therefore flows through the additional windings as through the solenoid coil. Only one power supply is thereby required to charge both the solenoid coil and the additional windings.

In a further embodiment, the additional windings and the solenoid coils are electrically insolated from each other. The currents to the additional windings are then kept correspondingly small and independent of the current through the solenoid coil. This facilitates use of thinner and therefore less expensive superconducting wire for the windings.

In an additional embodiment of the magnet configuration in accordance with the invention, a ferromagnetic jacket is provided about the magnet configuration in a radial region r8>r4 and optionally r8>r6. This ferromagnetic jacket can serve both as an additional shield of external fields as well as for suppressing the magnetic stray field.

The magnet configuration in accordance with the invention is advantageously a high field magnet configuration, wherein, in particular, the maximum axial component $B_z$ of the magnetic induction is greater than 6 T (Tesla). The advantages of the invention can thereby be best applied, since production of a sufficiently good homogeneity is particularly difficult in high field magnets using simple conventional magnet configurations.

The present invention also concerns a NMR, MRI or ICR device having a magnet configuration in accordance with the invention. NMR, MRI and ICR are widely use in medicine and in research and require homogenous magnetic fields. There is therefore a great need for improved apparatus which can carry out these procedures and which can be manufactured more economically. This is realized with the magnet configuration in accordance with the invention.

The invention also concerns a method for operation of the magnet configuration in accordance with the invention, wherein the additional windings are charged in a directed fashion up to the desired operational current values. This facilitates individual adjustment of the magnetic stray field.

In a particularly preferred variation of the method in accordance with the invention, the additional windings are superconductingly short circuited and their respective magnetic fluxes are thereby frozen prior to charging of a solenoid coil or coils with its operational current. In this manner, precisely those currents can be induced in the superconducting windings during charging of the solenoid coils, which minimize the magnetic fringe field.

In a variation, a (smaller) positive or negative current is introduced into the additional windings and superconductingly short circuited to realize improved fringe field suppression.

Alternatively, the current through the additional windings (or the currents in the case of a plurality of circuits) can be adjusted and frozen independent of the main current and to an optimal calculated or measured value.

Additional advantages of the invention can be extracted from the description and the drawing. The above mentioned features and those to be described below can be utilized in accordance with the invention individually or in arbitrary combination. The embodiments shown and described are not to be considered exhaustive enumerations, rather have exemplary character for illustrating the invention.

Table 1 is an embodiment of an inventive magnet configuration with dimensions, current densities and magnetic polarization of the components;

Table 2 are the field interferences $h_2 z_0^2$, $h_4 z_0^4$, ... of the magnet configuration according to Table 2 without field forming device at an axial position $z_0=0.05$ m, relative to the magnetic field $H_0$ produced by the magnet configuration at $z=0$.

Table 3 is the average axial position for the attachment of plates onto a cylindrical carrier or support of the field forming device of the magnet configuration in accordance with Table 1;

Table 4 is the occupation of the iron plates of the field forming device according to Table 3; and Table 5 is the theoretical field interferences $h_2$, $h_4$ ..., of the magnet configuration according to Table 1 with the field forming device according to Tables 3 and 4.

DESCRIPTION OF THE PREFERRED EMBODIMENT

Figure 1:
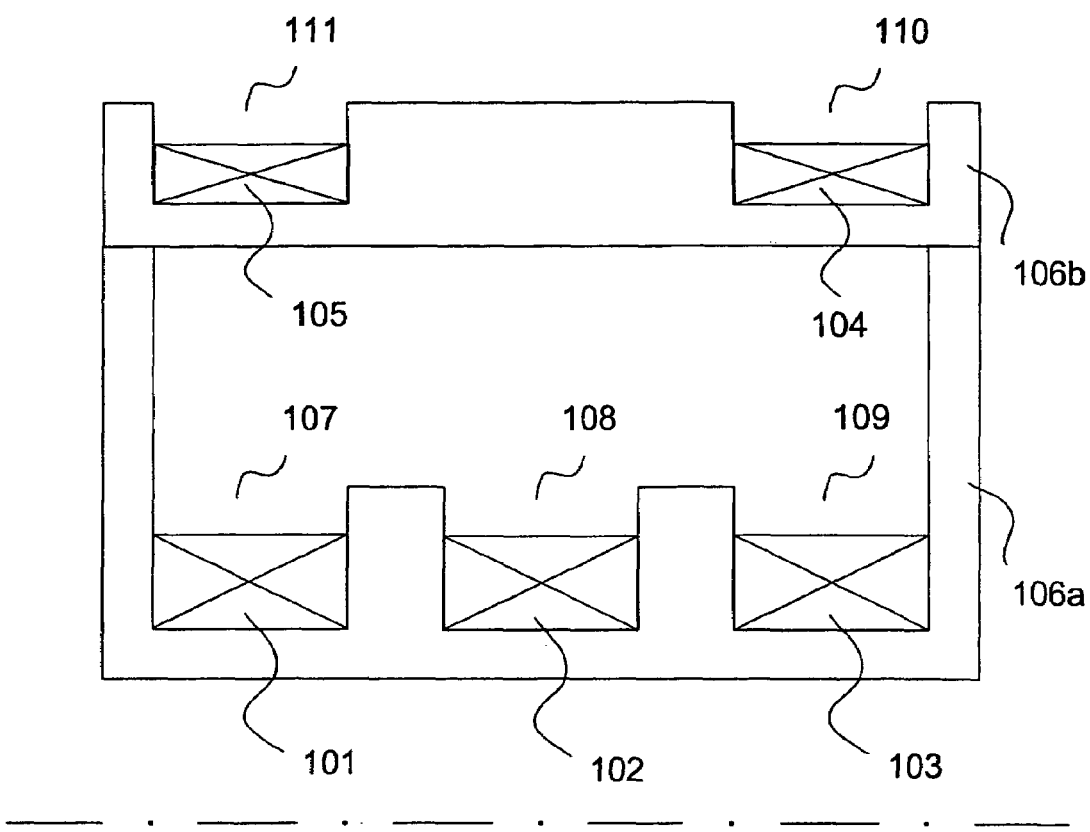
FIG. 1 shows a schematic representation of the magnetic coil configuration having a conventional active shielding.

FIG. 1 shows the principal components of a conventional rotationally symmetric magnet coil configuration. Winding chambers 107, 108, 109, 110, and 111 are fashioned into a two-part support body 106a, 106b. First magnet windings 101, 102, 103 and second magnet windings 104, 105, each made from superconducting coil wire, are wound in these winding chambers. First magnet windings 101, 102, 103 serve primarily to produce a strong magnetic field in an investigational volume which surrounds, e.g. in a magnetic coil configuration for a magnetic resonance apparatus, the symmetry center of the magnet coil configuration. The second magnet windings 104, 105 primarily serve for minimizing the fringe magnetic field in an outer region of the magnet coil arrangement by means of a feedback of the magnetic flux (active shielding). The direction of the electrical current in the second magnet windings 104, 105 is therefore opposite to the direction of the electrical current in the first magnet windings 101, 102, 103. The coils for minimizing the stray field in the configuration shown in FIG. 1 have a plurality of superconducting windings, which results in substantial expense. Furthermore, support bodies 106a and 106b are required both for the magnetic windings 101 and 102, 103 for producing the strong magnetic field in the investigational volume as well as for the second magnetic windings 105, 104 for shielding the magnetic fringe field. The support bodies 106a and 106b increase the weight and the radial size of the overall configuration.

Figure 2:
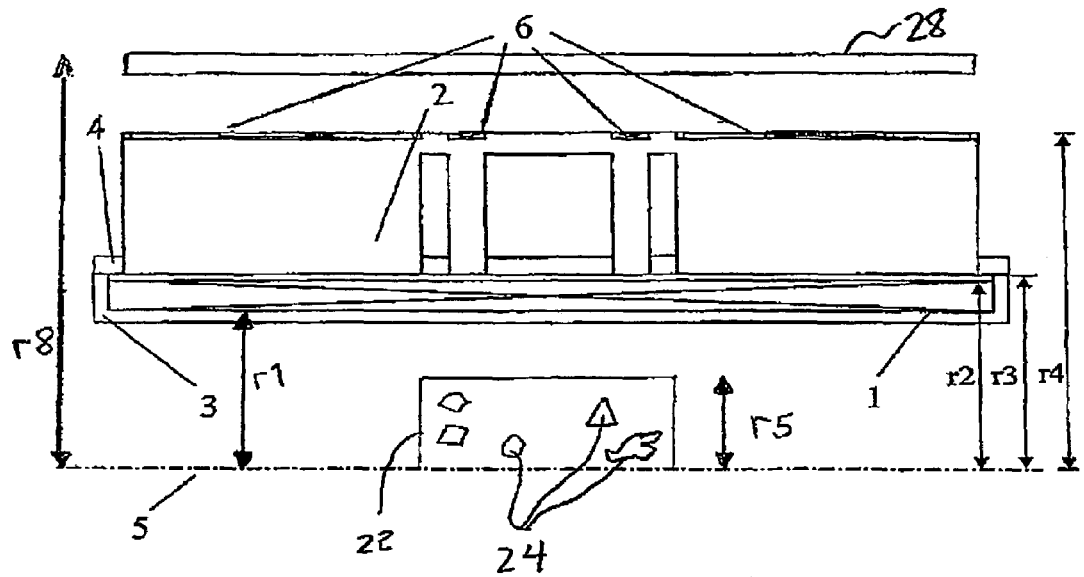
FIG. 2 shows a schematic representation of an embodiment of the magnet configuration in accordance with the invention including a solenoid coil and a structured magnet body.

FIG. 2 shows the construction of a magnet configuration in accordance with the invention which includes only one solenoid coil 1 for producing the main magnetic field which extends in a region between r1 and r2 and which is surrounded by a structured magnet body 2. The solenoid coil 1 is wound onto a coil body. The magnet body 2 and the solenoid coil 1 are mounted on support bodies 3, 4 and positioned in such a manner that both the magnetic body 2 as well as the solenoid coil 1 are rotationally symmetric with respect to the axis 5 of the magnet configuration. The magnet body 2 is magnetized by the magnetic field produced by the solenoid coil 1 in a direction which is opposite to the magnetic induction in the region of the axis 5 and thereby strengthens the overall magnetic field of the configuration. The magnet body 2 is disposed in a radial region between r3 and r4 such that the difference between r4 and r3 defines the thickness of the magnet body 2. This thickness should be chosen sufficiently large such that the structuring of the magnet body 2 is suitable for homogenizing. The size of r3 or r4 depends on the size of the solenoid coil 1, wherein preferentially r3<1.3 r2 and 3r3>r4>1.5 r3. Through a suitable structuring of the magnet coil in its radially inner region (as shown for example in FIG. 2) undesirable interfering terms of the magnetic field strengths ($h_2$, $h_4$, $h_6$ ... ) can be compensated for. In addition to the homogenization of the magnetic field in the investigational volume, the magnet body 2 also causes an additional shielding of the stray field produced by the magnet configuration. This shielding can be influenced through a suitable choice of the outer diameter r4 of the magnet bodies 2. In addition, additional windings 6 can be disposed outside of the magnet body 2 which serve to guide flux and thereby to improve the shielding of the stray field and which will be described more closely in connection with FIGS. 5a and 5b. The magnet configuration can be equipped with a field forming device disposed in a radial region r5<r1. The field forming device can comprise a cylindrical ferromagnetic foil 22 having openings 24. A ferromagnetic jacket 28 can surround the magnet configuration at a radially outward region r8.

Figure 3:
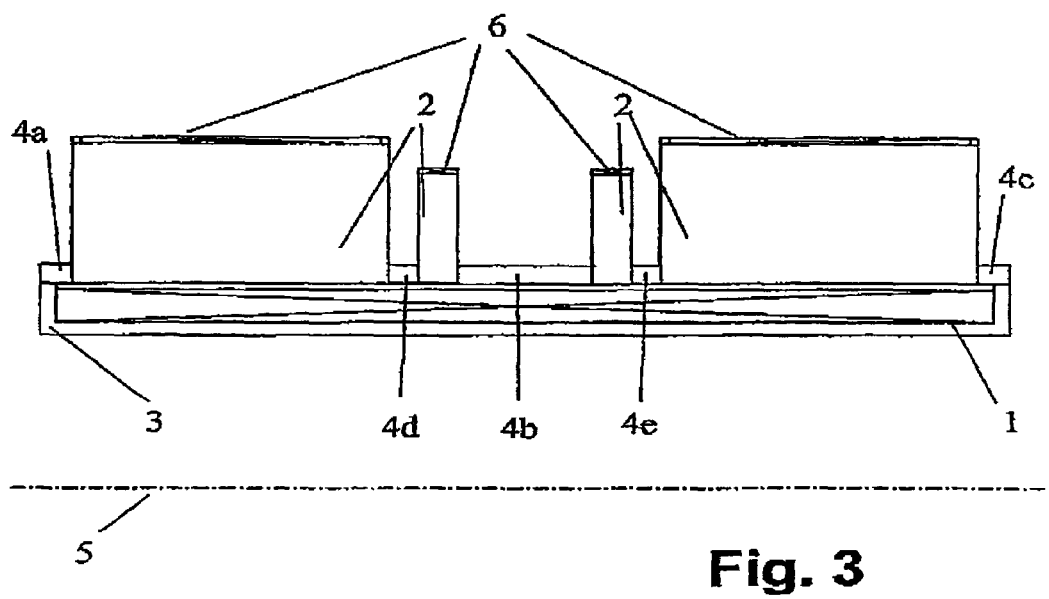
FIG. 3 is a schematic representation of an embodiment in accordance with the invention of a magnet configuration including a solenoid coil and four magnet bodies.

As shown in FIG. 3, instead of a structured magnet body 2, a plurality (in this case four) of rotationally symmetric magnet bodies 2 can be disposed about the solenoid coil 1. The individual magnet bodies are rigidly connected to each other via support body 4a, 4b, 4c, 4d, and 4e and connected to the support body 3 for the solenoid coil so that the magnet bodies 2 cannot be moved relative to each other and also relative to the solenoid coil under the influence of the magnet forces.

Figure 4:
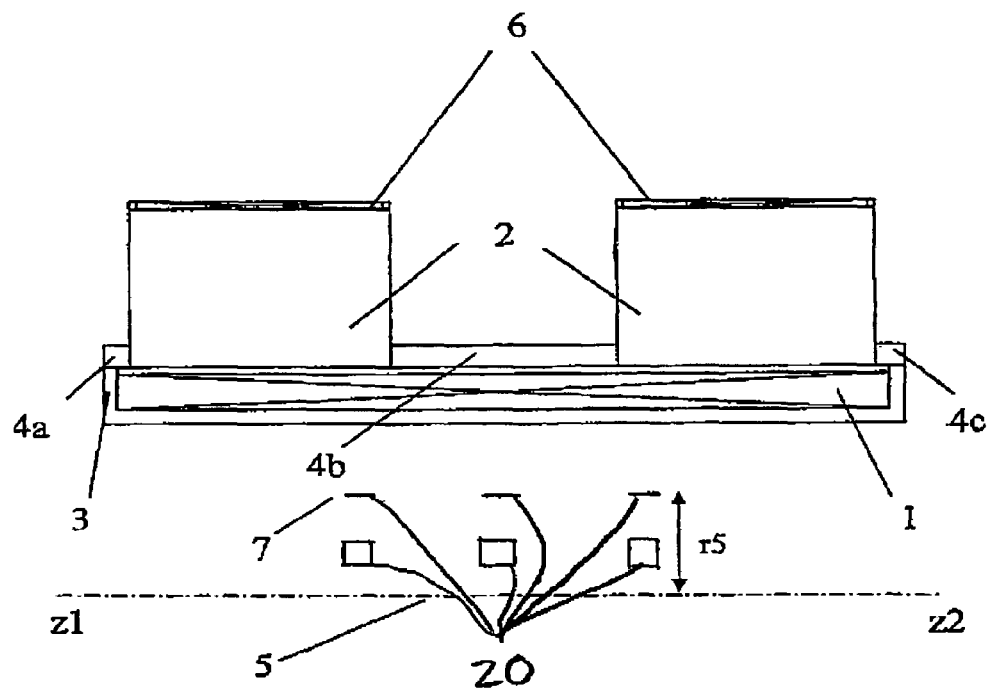
FIG. 4 is a particularly preferred embodiment of the inventive magnet configuration including a solenoid coil and two magnet bodies and a field forming device.

FIG. 4 shows a particularly preferred embodiment of the invention. The magnet configuration shown herein includes a solenoid coil 1, two magnet bodies 2 made from iron, two additional windings 6 which directly surround the magnet body 2 as well as a field forming device 7 which is disposed radially inside of the solenoid coil 1. The magnet coils 2 are connected to mechanical holders 4a, 4b, 4c to form one single mechanical component. The mechanical holders can, e.g., be made from non-magnetized steel and must be structured in such a fashion that they can accept the attractive forces between the magnet bodies 2 caused by the magnetizations. The configuration of the magnet bodies 2 is symmetric with respect to the middle plane transverse to the axis 5 of the magnet configuration. The magnet bodies 2 are preferentially formed as circular rings having rectangular cross-section and are disposed in an axial external region of the magnet configuration so that the bordering surfaces of the magnet bodies 2 are relatively far removed from the investigational volume. This is particularly advantages since, in this case, the bordering surfaces of the magnet body have nearly no interfering influence of the homogeneity of the investigational volume and, moreover, the magnet body 2 has the desired positive contribution to the magnetic field term $h_2/h_0$. The magnet configuration may include a field forming device disposed in a radial region r5<r1. The field forming device can comprise ring-shaped element groups having individual elements 20.

In addition to the homogenization of the magnetic field in the investigational volume of the magnet configuration, the device in accordance with the invention is also suitable for minimizing the magnetic stray field outside of the magnet configuration. In order achieve an additional reduction in the stray field, in the configurations in accordance with FIG. 2 through 4, additional super-conducting windings 6 are disposed in a region r6>0.9 r4 radially outside of the magnet bodies 2. The magnet bodies 2 can thereby serve as support bodies for the windings 6 so that same can be directly wound onto the magnet bodies 2. The windings 6 consists essentially of partial windings which are axially separated from each other, each of which can is disposed in a winding chamber. The magnet bodies 2 can, towards this end, have recesses in radially outer regions in which the winding chambers for the additional windings can be accepted. In this fashion, no additional support body is required for the additional winding 6. In addition to reduction of the magnetic fringe field, the windings 6 also serve to damp external interferences on the magnetic field in the working volume.

Figure 5A:
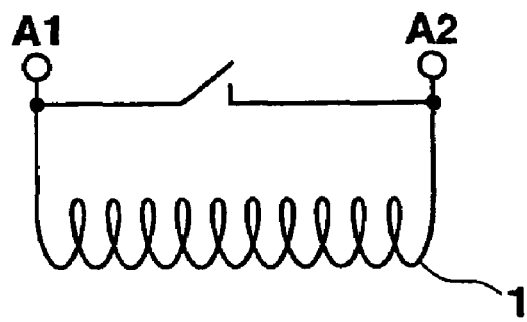
FIG. 5a is a circuit diagram of a coil configuration having a solenoid coil and a plurality of short circuited additional windings.
Figure 5A:
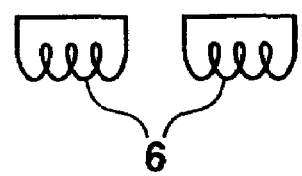

FIG. 5a shows a circuit diagram of a coil configuration having a solenoid coil 1 and additional windings 6 which are disposed radially outside of the solenoid coil 1. The superconducting coil circuits are, in this case, without contact so that the currents flowing in the windings 6 and in the solenoid coil 1 are independent of each other. The current through the windings 6 can therefore, in dependence on the configuration, be quite small and as a result several windings 6 can be produced from thin superconducting wire. The windings 6 can be short circuit prior to charging of the solenoid coil 1. During the charging process for the solenoid coil 1, the magnet bodies 2 are magnetized and the windings 6 are inductively charged. This is advantageous since, when charging or discharging the solenoid coil 1, the magnetization of the magnet coil 1 does not follow the current in the solenoid coil 1 in a proportional fashion due to hysterisis as well as saturation of the material. In consequence thereof, the magnetic fringe field of a magnet configuration comprising the solenoid coil 1 and the magnet bodies 2 only, would not be minimized. However, in the short circuited superconducting winding 6, precisely those currents are induced which keep the magnetic flux and thereby the field profile constant. The windings 6 therefore act as shielding windings of an active shielding, however are strongly supported by the magnetized iron of the magnet body 2 which assumes the main function of the shielding. The current in the windings 6 assumes this function to a greater and greater extent as the iron approaches saturation.

Figure 5B:
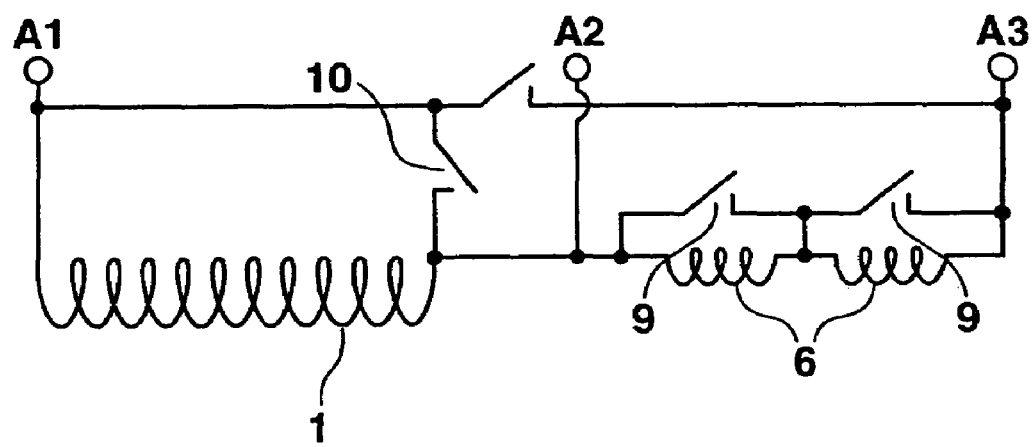
FIG. 5b is a circuit diagram of a coil configuration having a solenoid coil and a plurality of additional windings which can be connected to the solenoid coil.

FIG. 5b shows a circuit diagram of another current configuration which can be operated in several different modes. The additional windings 6 are thereby provided with superconducting switches 9. The windings 6 are connected in series with the solenoid coil 1. This facilitates a common charging of the solenoid coil 1 and the winding 6 via the connections A1 and A3. In this case, the same current flows in the windings 6 as in the solenoid coil 1. Moreover, the windings 6 can also be charged via the connection A2 and A3 and the solenoid coil 1 via the connections A1 and A2, independent of each other. Through a directed charging of the windings 6 up to a desired operational current, an individual adjustment of the magnetic fringe field is rendered possible (active shielding). The principle of active shielding is known in prior art. However, the windings 110, 111 (FIG. 1) which are usually used are made from a large amount of superconducting material in layers. The cost of an apparatus shield of this kind is therefore very high in conventional magnetic configurations. However, due to the shielding effect of the magnet bodies 2 in accordance with the invention, only 1 to 10 layers of superconducting material are normally needed for the additional windings 6. In the circuit in accordance with FIG. 5b, the windings 6 of the solenoid coil 1 can be operated in a short circuited state by closing the switch 9 or the switch 10 so that the stray field is minimized and a respective magnetic flux can be frozen. In a coil configuration which is circuited in accordance with FIG. 5b, the windings 6 can thereby be optionally short circuited, charged externally, or partially together with the solenoid coil 1. When configuring the system, the influence of the additional windings 6 on the field in the investigational volume must also be taken into account. Due to the configuration of the windings 6 in the outer region of the magnet configuration and due to the low number of windings this influence is, however, small.

The geometrical dimensions and the properties of an example of the embodiment of FIG. 4 for the inventive magnet configuration are specified in tables 1 through 5. In table 1, the components of the inventive magnet configuration are listed as entries with respect to their axial and radial dimensions, the current densities and polarization of the windings and of the magnet body as well as the field forming device. The configuration produces a homogenous field having an induction of 7.009 T.

The preferred embodiments of the magnet configuration shown in FIG. 4 have a field forming device 7 which is disposed radially inside the solenoid coil 1. This permits attachment of small field forming elements made from iron in, preferentially, 15 axial and, in each case, 40 positions distributed about the periphery on the surface of a cylinder having radius r5 which, for example, is r5=0.07 m. Without the field forming device 7, the simple geometry of the solenoid coil 1 of the magnet configuration produces, theoretically and practically, a magnetic field which is inhomogeneous and therefore not usable as a magnetic configuration for NMR, MRI and FTMS applications. Table 2 shows the field interferences $h_2 z_0^2$, $h_4 z_0^4$, . . . of the magnet configuration according to Table 1 without the field forming device at an axial position $z_0=0.05$ m, relative to the magnet field $h_0$ of the magnet configuration at z=0. The choice of $z_0=0.05$ m corresponds approximately to the radial extent of the approximately spherical region about the center z=0 in which the magnet configuration including the field forming device should produce a field with deviations of less than 10 ppm. Only after a suitable distribution of the field forming elements, for example in the form of rectangular plates made of iron, is a homogenous magnetic field with increased larger spatial extent produced, which is excellently suited for the above mentioned applications. Table 3 shows the average axial positions for attachment of plates made of iron having dimensions of 14 mm×10 mm×0.2 mm onto a cylindrical support of the field forming device. For every axial position, 40 azimuthal positions are provided about the periphery. The plates are located on an average cylinder radius r5=70 mm. The field forming device can, e.g. be integrated in the gradient coil configurations which are necessary for imaging NMR procedures or localized NMR spectroscopy or, alternatively, can be attached to the room temperature bore of a cryostat of the magnet configuration. The occupation of the iron plates of the field forming device according to table 3 at the 15 axial positions indicated with A, B, C, . . . as well as the 40 azimuthal positions which are designated with 1, 2, 3, . . . , is shown in table 4. With this occupation, the overall magnetic field configuration produces a homogenous magnetic field. The field deviations listed in table 2 of the magnet configuration without field forming device are reduced to the field deviations listen in table 5 by means of these occupations. The plates having overall mass of 3.42 kg.

Figure 6:
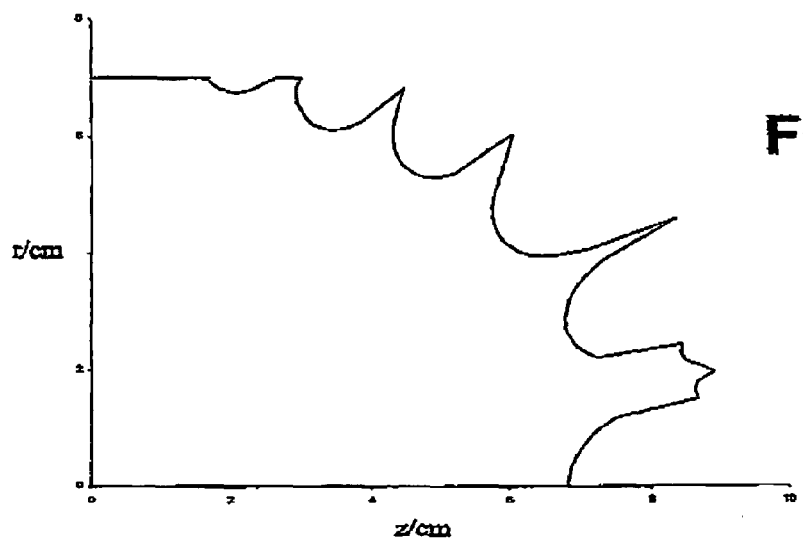
FIG. 6 is the contour line r(z) of constant relative deviation of the magnetic field strength of the magnet configuration of FIG. 4.

FIG. 6 shows the contour line r (z) of constant relative deviation of the magnetic field strength from +/−5 ppm relative to the field at the center of a magnet configuration according to tables 1 through 5 in a quadrant of the bore. Within the contour line, the relative deviation of the magnetic field strength is less than +/−5 ppm. In the region z<3 cm, this region is limited by the field forming device with a relatively small radius r5=7 cm. Such field forming devices 7 are conventional in magnet configurations for MRI apparatus and thereby serve for the correction of inhomogeneities in the magnetic field in consequence of geometric deviations of the magnetic apparatus winding from the theoretical ideal configuration due to unavoidable mechanical tolerances in the coil bodies used and in the superconducting winding. The distribution of field forming elements for correcting the original inhomogeneities in the magnetic field which are suitable for calculation methods and which can be determined through measurements are known to one of average skill in the art for construction of conventional apparatus or MRI applications. It is, however, extremely surprising to see how the theoretically expected inhomogeneities of the inventive magnet configuration without consideration of the field forming device 7 can be compensated for in the example with such a small amount of field forming elements. In order to keep the amount of field forming elements in the field forming device low and simultaneously provide for a large working volume with high homogeneity of the magnetic field, the magnetic field configuration advantageously has, without considering the field forming device 7, a negative magnetic field term $h_4/h_0$ and a positive magnetic field form $h_2/h_0$. These magnetic field terms can be adjusted to the choice of the axial limits z1 and z2 of the solenoid coil 1 as well as the two magnet bodies 2 as well as to the inner radius r3 of the magnet body 2 in the manner mentioned. Corresponding methods are known to one of average skill in the art for the construction of conventional magnet configurations. By incorporation of the field forming device in the configuration of the system, the magnet configuration has a shorter construction. A field forming device 7 of this kind can also be made from ferromagnetic foils or sheet metal having openings which are suitable for homogenizing the magnetic field in the investigational volume as published in US 2002/0,140,535A1. It has turned out to be particularly advantageous when the quotient between the magnetic field terms $h_2$ and $h_4$ which is multiplied by (−1) is at least equal to half of the square of the radius r5 of the field forming device. In this fashion, high homogeneities can be achieved for the magnetic field in a large investigational volume using particularly small amounts of field forming elements in the field forming device. In the embodiment described in tables 1 through 5, the quotient between the magnetic field terms $(-h_2/h_4)$ is approximately 91 cm$^2$: significantly larger than $0.5\ r5^2 = 24.5$ cm$^2$. As shown in FIG. 6, the diameter of the homogenous volume having relative field interferences of less than 10 ppm is approximately 14 cm. The amount of field forming elements made from iron in accordance with table 5 is 3.42 kg.

The present invention facilitates a compact and economical construction for a magnet configuration for measurement of magnetic resonance in particular for the production of high fields (B>6 T) with the assistance of which, the homogeneity of the magnetic field in the investigational volume and the reliability of the magnet configuration can be simultaneously improved.

I claim:

1. A coaxial magnet configuration for the production of a magnetic field which is suitable for the measurement of magnetic resonance in an investigational volume, the magnet configuration comprising:
    at least one superconducting solenoid coil or a plurality of radially nested solenoid coils, said solenoid coil having windings disposed in a radial region about an axis of the magnet configuration between r1 and r2, wherein r1<r2; and
    at least one rotationally symmetric magnet body made from a ferromagnetic material, said magnet body surrounding said windings and extending through a radial region between r3 and r4, wherein r3<r4, r2<r3<1.3 r2, and r4>1.3 r3, said rotationally symmetric magnet body being structured, dimensioned, and positioned to render the magnetic field in the investigational volume homogenous and to substantially suppress magnetic fringe fields outside of the magnet configuration.

2. The magnet configuration of claim 1, wherein precisely two magnet bodies are provided which are disposed symmetrically with respect to a middle plane transverse to the axis of the magnet configuration and/or which are configured as circular rings with rectangular cross-sections.

3. The magnet configuration of claim 1, wherein precisely four magnet bodies are provided which have a circular ring shape with rectangular cross-section.

4. The magnet configuration of claim 3, wherein said solenoid coil and said magnet body produce a magnetic field shape in the investigational volume whose z component is given by a series expansion along the z-axis about a symmetry center of the investigational volume as:

$$h = h_0 + h_2 z^2 + h_4 z^4 + \ldots + h_{2n} z^{2n},$$

wherein said magnet bodies are positioned and dimensioned in such a fashion that magnetic field terms of second, fourth, and sixth order vanish ($h_2 = h_4 = h_6 = 0$).

5. The magnet configuration of claim 1, wherein the magnet configuration forms at least a magnet configuration of $10^{th}$ order with a residual ripple of $<10^{-5}$ in the investigational volume.

6. The magnet configuration of claim 1, wherein said magnet body is made from a soft magnetic material, from iron, or from magnetic steel.

7. The magnet configuration of claim 1, wherein r4>1.5 r3.

8. The magnet configuration of claim 1, wherein r4<3 r3.

9. The magnet configuration of claim 1, wherein r4 is chosen in such a fashion that a magnitude of magnetic induction B in the magnet body in a radial region between r3 and 1.05 r3 is at least equal to a magnitude of saturation polarization $M_s$ of said ferromagnetic material.

10. The magnet configuration claim 1, wherein said magnet body is cooled or is cooled to a same cryogenic temperature as said superconducting solenoid coil.

11. The magnet configuration of claim 10, wherein said magnet body is rigidly connected to a support body of said solenoid coil.

12. The magnet configuration of claim 1, further comprising additional windings made from superconducting wire, said additional windings being disposed radially outside of said magnet body or in a radial region at an outer edge region of said magnet body.

13. The magnet configuration of claim 12, wherein said additional windings can be superconductingly short circuited, at least during operation.

14. The magnet configuration of claim 12, wherein said magnet body serves as a support body for said additional windings.

15. The magnet configuration of claim 12, wherein said additional windings include only one or two layers of superconducting wire.

16. The magnet configuration of claim 12, wherein said additional windings include a plurality of partial windings which are axially separated from another, each of which can be individually superconductingly short circuited.

17. The magnet configuration of claim 12, wherein said additional windings can be circuited in series with said solenoid coil in a superconducting fashion.

18. The magnet configuration of claim 17, wherein said additional windings are always in electrical contact with said solenoid coil.

19. The magnet configuration of claim 12, wherein said additional windings and said solenoid coil are electrically insulated from each other.

20. A method for operating the magnet configuration of claim 12, wherein said additional windings are directly charged to a desired operational current value.

21. A method for operating the magnet configuration of claim 12, wherein said additional windings are superconductingly short circuited to freeze a respective magnetic flux prior to charging of said solenoid coil with a predetermined operational current.

22. A method for operating the magnet configuration of claim 12, wherein a positive or negative current is fed into said additional windings and superconductingly short circuited.

23. A method for operating the magnet configuration of claim 12, wherein a current through said additional windings is adjusted and frozen at a value, which is calculated or determined through measurement, said current being independent of a main current.

24. The magnet configuration of claim 1, further comprising a ferromagnetic jacket disposed about the magnet configuration in a radial region r8>r4.

25. The magnet configuration of claim 1, wherein the magnet configuration is a high field magnet configuration or a magnet configuration having a maximum axial component $B_z$ of magnetic induction which is larger than 6 T.

26. An NMR, MRI, or ICR apparatus, comprising the magnet configuration of claim 1.

27. The magnet configuration of claim 1, further comprising a field forming device made from ferromagnetic material, said field forming device disposed in a radial region r5<r1, wherein said rotationally symmetric magnet body and said field forming device are structured, dimensioned, and positioned to render the magnetic field in the investigational volume homogenous and to substantially suppress a magnetic stray field outside of the magnet configuration.

28. The magnet configuration of claim 27, wherein said field forming device includes at least 3 or at least 10 ring-shaped element groups, wherein each element group has at least 6 or at least 12 individual elements distributed on a corresponding ring, in a peripheral direction.

29. The magnet configuration of claim 27, wherein said field forming device comprises a cylindrically shaped, curved ferromagnetic foil having openings.

30. The magnet configuration of claim 27, wherein said solenoid coil, said magnet body, and said field forming device generate a magnetic field shape in the investigational volume whose z components, in a series expansion along a z-axis about a symmetry center of the investigational volume, are given by:

$$h = h_0 + h_2 z^2 + h_4 z^4 + \ldots + h_{2n} z^{2n},$$

wherein a common contribution of said solenoid coil and said magnet body to the magnet field term of second order is positive and to the magnetic field term of fourth order is negative, wherein a contribution of said field forming device to the magnetic field term of second order is negative and to the magnetic field term of fourth order is positive.

31. The magnet configuration of claim 27, wherein a quotient, multiplied by (−1), between magnetic field terms $h_2$ and $h_4$ is at least equal to half a square of the radius r5 of said field forming device.

* * * * *